(12) United States Patent
Takai et al.

(10) Patent No.: US 11,916,547 B2
(45) Date of Patent: *Feb. 27, 2024

(54) SEMICONDUCTOR RELAY DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Naoya Takai, Yukuhashi Fukuoka (JP); Yukihiro Takifuji, Chikujo Fukuoka (JP); Keita Saito, Buzen Fukuoka (JP); Kazuki Tanaka, Kitakyushu Fukuoka (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/902,737

(22) Filed: Sep. 2, 2022

(65) Prior Publication Data

US 2022/0416787 A1 Dec. 29, 2022

Related U.S. Application Data

(63) Continuation of application No. 17/473,889, filed on Sep. 13, 2021, now Pat. No. 11,476,850.

(30) Foreign Application Priority Data

Mar. 23, 2021 (JP) .................................. 2021-048949

(51) Int. Cl.
*H03K 17/00* (2006.01)
*H03K 17/081* (2006.01)
(Continued)

(52) U.S. Cl.
CPC ... *H03K 17/6874* (2013.01); *H03K 17/08108* (2013.01); *H03K 17/73* (2013.01)

(58) Field of Classification Search
CPC ......... H03K 17/6874; H03K 17/08108; H03K 17/0403; H03K 2017/0806; H03K 17/105; H03K 17/74; H01L 27/0284
See application file for complete search history.

(56) References Cited

U.S. PATENT DOCUMENTS 4,754,175 A * 6/1988 Kobayashi ....... H03K 17/04123
257/292
4,924,344 A * 5/1990 Guajardo ................. H02H 9/04
361/86

(Continued)

FOREIGN PATENT DOCUMENTS

JP 2801825 B2 9/1998
JP H11-17214 A 1/1999

(Continued)

*Primary Examiner* — Tuan T Lam
(74) *Attorney, Agent, or Firm* — Kim & Stewart LLP

(57) ABSTRACT

A semiconductor relay device includes a conversion circuit configured to receive an input signal from outside and pass a first current to a first node based on the input signal. A zener diode has an anode coupled to a second node and a cathode coupled to the first node. A resistor is coupled between the second node and a third node. A number n of diodes are serially coupled. A thyristor has an anode coupled to the first node, a cathode coupled to the second node, and a control terminal coupled to the third node. A transistor has a gate coupled to the first node. An anode of a diode at a first end of the n diodes is coupled to the first node, and a cathode of a diode at a second end of the n diodes is coupled to a third node.

11 Claims, 12 Drawing Sheets

(51) Int. Cl.
*H03K 17/687* (2006.01)
*H03K 17/73* (2006.01)

(56) References Cited

U.S. PATENT DOCUMENTS

| | | | | |
|---|---|---|---|---|
| 5,285,346 | A | * | 2/1994 | Davies ............. H03K 17/08122 |
| | | | | 361/57 |
| 5,408,102 | A | * | 4/1995 | Okumura ............. H03K 17/785 |
| | | | | 250/551 |
| 5,418,381 | A | * | 5/1995 | Aizawa ................ H03K 17/785 |
| | | | | 257/E31.108 |
| 5,708,277 | A | | 1/1998 | Murayama et al. |
| RE35,836 | E | * | 7/1998 | Rodriguez ............ H01L 31/167 |
| | | | | 250/551 |
| 10,523,198 | B1 | | 12/2019 | Gambuzza et al. |
| 11,302,020 | B2 | | 4/2022 | Matsuo et al. |
| 2003/0029990 | A1 | * | 2/2003 | Fang .................... H03K 17/785 |
| | | | | 250/214 R |
| 2013/0307514 | A1 | * | 11/2013 | O'Connell ........... H03K 17/785 |
| | | | | 250/551 |
| 2016/0204603 | A1 | | 7/2016 | Bobert et al. |
| 2021/0226468 | A1 | | 7/2021 | Zagrodnik |

FOREIGN PATENT DOCUMENTS

| | | |
|---|---|---|
| JP | 2986698 B2 | 12/1999 |
| JP | 2000-252515 A | 9/2000 |
| JP | 2003-133925 A | 5/2003 |
| JP | 3476903 B2 | 12/2003 |
| JP | 2005-166851 A | 6/2005 |
| JP | 2010-171574 A | 8/2010 |

* cited by examiner

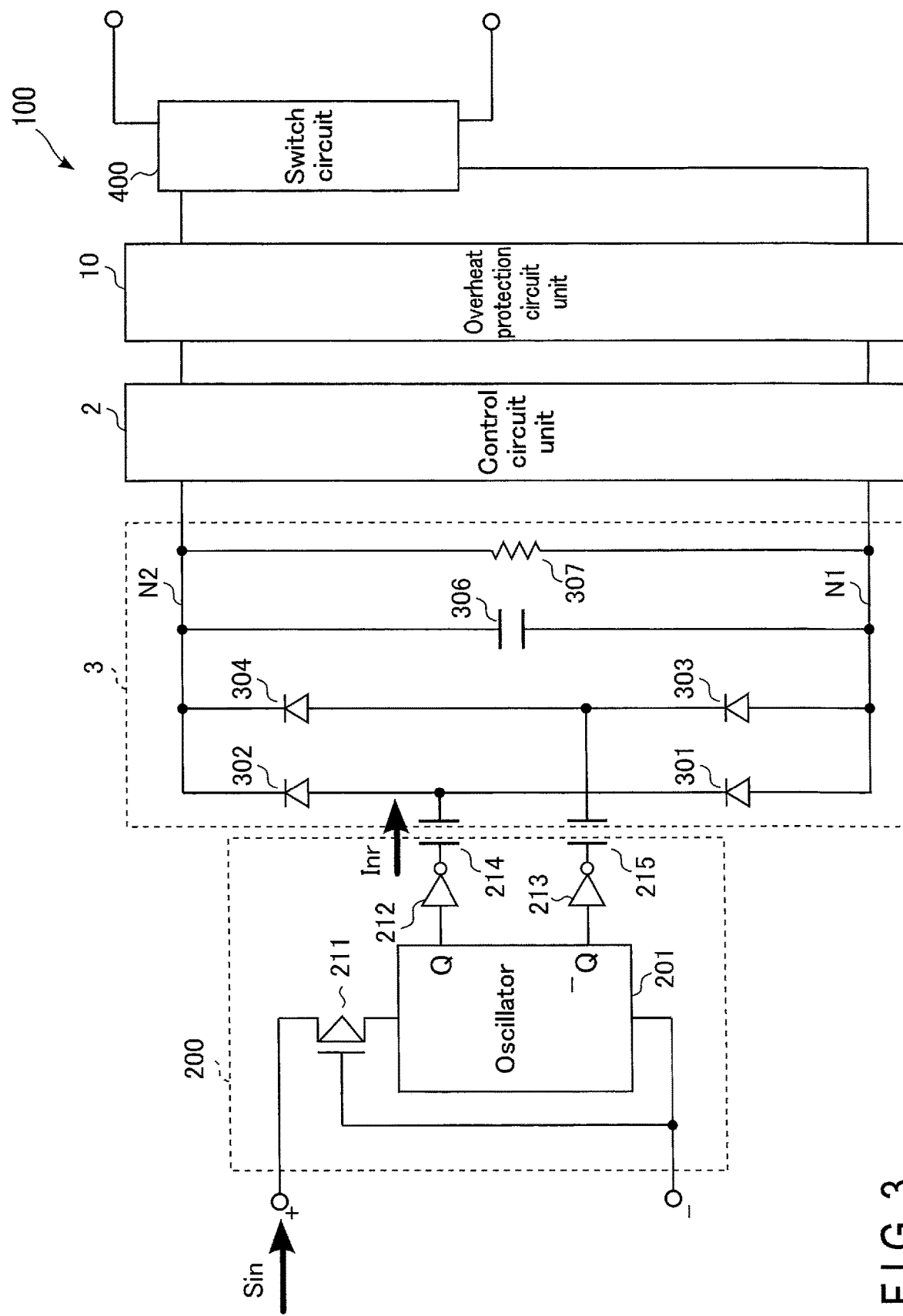
F I G. 3

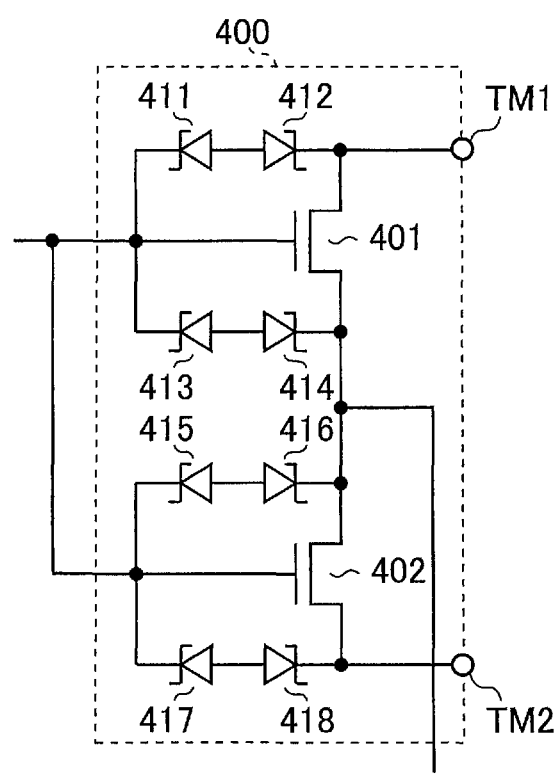
F I G. 11

SEMICONDUCTOR RELAY DEVICE

CROSS-REFERENCE TO RELATED APPLICATIONS

This application is a continuation of U.S. patent application Ser. No. 17/473,889, filed Sep. 13, 2021, which application is based upon and claims the benefit of priority from Japanese Patent Application No. 2021-048949, filed Mar. 23, 2021, the entire contents of which are incorporated herein by reference.

FIELD

Embodiments described herein relate generally to a semiconductor relay device.

BACKGROUND

Semiconductor relay devices configured to open and close the circuit of an apparatus based on an input signal, with the output terminal of the devices coupled to the apparatus, have been known. Some of such semiconductor relay devices adopt a device (or, component) incorporating a semiconductor to control the opening and closing of the circuit. The semiconductor relay devices of this type may receive input signals in a non-contact manner, for example, magnetically, capacitively, or optically. In general, such semiconductor relay devices are required to have a mechanism for protecting the output-side apparatus from the influence of overvoltage application, overcurrent inflow, and overheating.

BRIEF DESCRIPTION OF THE DRAWINGS

FIG. 3 is a diagram showing the circuitry structure and functional block of a semiconductor relay device of a second coupling type according to the first embodiment.

FIG. 11 shows an application example of the semiconductor relay device according to the first embodiment.

DETAILED DESCRIPTION

Figure 1:
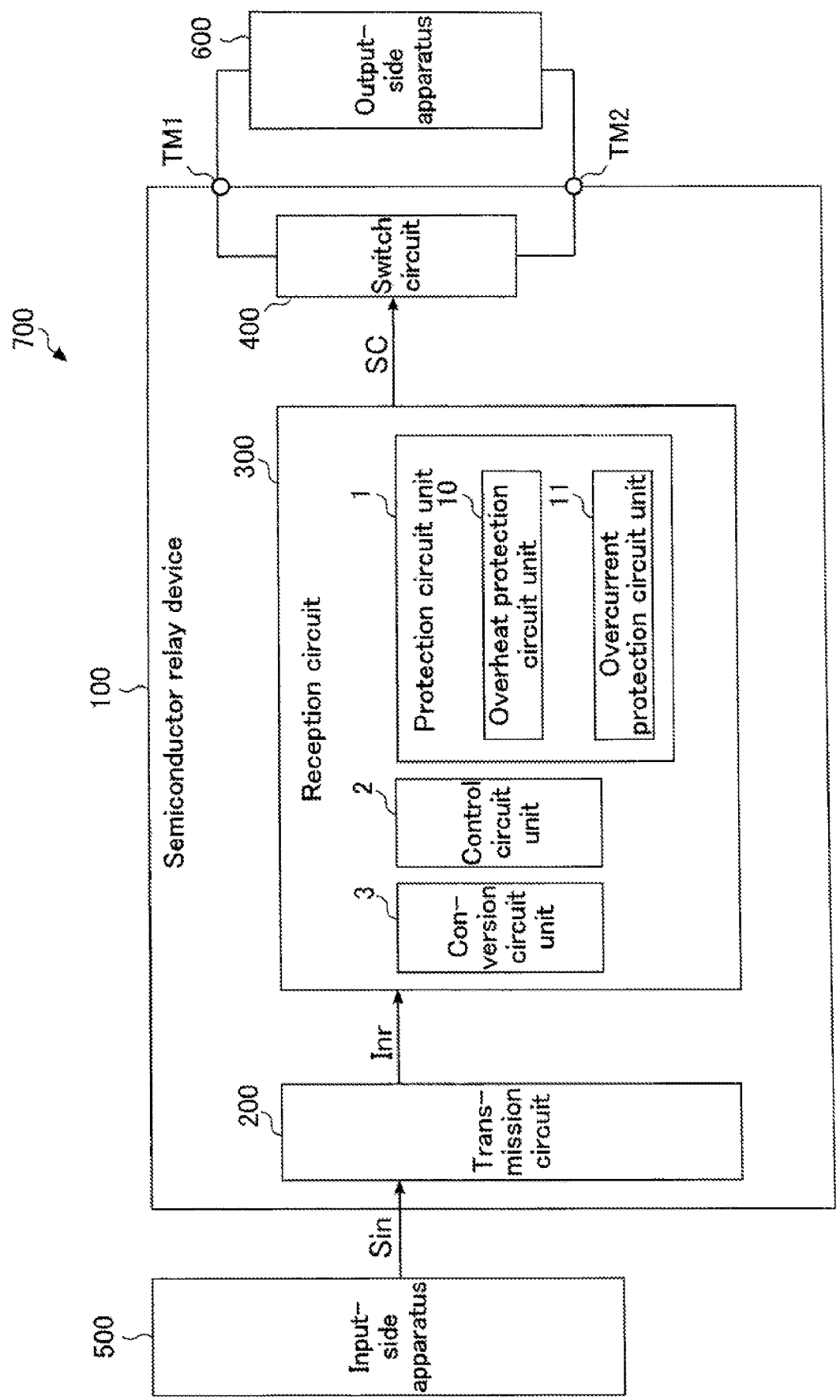
FIG. 1 is a functional block diagram of a system according to the first embodiment.

In general, according to one embodiment, a semiconductor relay device includes: a conversion circuit configured to receive an input signal from outside and pass a first current to a first node based on the input signal; a zener diode having an anode coupled to a second node and a cathode coupled to the first node; a resistor coupled between the second node and a third node; a number n of diodes that are serially coupled where n is a natural number larger than or equal to 2; a thyristor having an anode coupled to the first node, a cathode coupled to the second node, and a control terminal coupled to the third node; and a transistor having a gate coupled to the first node. An anode of a diode at a first end of the n diodes is coupled to the first node, and a cathode of a diode at a second end of the n diodes is coupled to the third node.

Embodiments will now be described with reference to the figures. In the following description, components with substantially the same functionalities and configurations will be referred to with the same reference numerals, and repeated descriptions may be omitted.

In the specification and the claims, a phrase of a particular first component being "coupled" to another second component includes the first component being coupled to the second component either directly or via one or more components which are always or selectively conductive.

1. First Embodiment

1.1. Structure

1.1.1. System

FIG. 1 is a functional block of a system 700 according to the first embodiment. The system 700 can be realized as an air conditioner. As illustrated in FIG. 1, the system 700 includes an input-side apparatus 500, a semiconductor relay device 100, and an output-side apparatus 600.

The input-side apparatus 500 transmits an input signal Sin to the semiconductor relay device 100. The input signal Sin is an electric signal that transports information for on/off control of the output-side apparatus 600. Examples of the input-side apparatus 500 include a remote controller in the case of the system 700 being an air conditioner. Examples of the input signal Sin include a thermostat control signal in the case of the system 700 being an air conditioner.

The output-side apparatus 600 is coupled to the semiconductor relay device 100, and is turned on/off under the control of the input-side apparatus 500 by way of the semiconductor relay device 100. Examples of the output-side apparatus 600 include a motor for controlling a solenoid valve in the case of the system 700 being an air conditioner.

The semiconductor relay device 100 receives an input signal Sin, based on which the semiconductor relay device 100 turns the output-side apparatus 600 on or off, while maintaining the input-side apparatus 500 and output-side apparatus 600 in a mutually electrically disconnected state. The semiconductor relay device 100 adopts any coupling form that allows for signal transmission. Examples of coupling forms include capacitive, magnetic and optical couplings. The semiconductor relay device 100 can be a semiconductor component that includes multiple chips (or, semiconductor chips) containing semiconductor elements and a package for sealing the semiconductor chips.

The semiconductor relay device 100 includes a transmission circuit 200, a reception circuit 300, and a switch circuit 400.

The transmission circuit 200 generates an input signal Inr from the input signal Sin. The transmission circuit 200 may be a semiconductor chip. The details of the transmission circuit 200 depend on the form of coupling adopted by the semiconductor relay device 100. The form of an input signal Inr also depends on the form of coupling adopted by the semiconductor relay device 100. The specific example of the transmission circuit 200 will be described later.

The reception circuit 300 is separated through electrical insulation from the transmission circuit 200. The reception circuit 300 is configured to transmit signals and may be coupled to the transmission circuit 200 in any manner except for electrical coupling. That is, the reception circuit 300 is configured to receive input signals Inr that are dependent on the form of coupling adopted by the semiconductor relay device 100. The details of the reception circuit 300 are based on the coupling of the transmission circuit 200 and reception circuit 300. The reception circuit 300 generates a control signal SC based on an input signal Inr. The reception circuit 300 can be a semiconductor chip, and will be described later in detail.

The switch circuit 400 has one end coupled to a terminal TM1 and the other end coupled to a terminal TM2. The switch circuit 400 receives the control signal SC, and turns on or off based on this control signal SC. In other words, the switch circuit 400 electrically connects and disconnects the terminal TM1 and the terminal TM2. The control signal SC can represent a state of keeping the switch circuit 400 on, or a state of keeping the switch circuit 400 off. The state of the control signal SC keeping the switch circuit 400 on may be referred to as the ON command state of the control signal SC. On the other hand, the state of the control signal SC keeping the switch circuit 400 off may be referred to as the OFF command state of the control signal SC. The switch circuit 400 may be a semiconductor chip. Based on the control signal SC, the switch circuit 400 turns on, or in other words establishes an electrical conduction between the terminal TM1 and terminal TM2. Based on the control signal SC, the switch circuit 400 also turns off, or in other words terminates the electrical conduction between the terminal TM1 and terminal TM2. The switch circuit 400 forms part of the path through which the current necessary for the operation of the output-side apparatus 600 flows, or current path. While the switch circuit 400 remains on, the current path for the output-side apparatus 600 remains formed so that the output-side apparatus 600 can operate, or in other words, the output-side apparatus 600 remains on. While the switch circuit 400 remains off, the current path for the output-side apparatus 600 is not formed. The output-side apparatus 600 is therefore not prepared to operate, or remains off.

The reception circuit 300 will be further described. The reception circuit 300 includes a protection circuit unit 1, a control circuit unit 2, and a conversion circuit unit 3. The control circuit unit 2 regulates the voltage of an electric signal obtained through the conversion performed by the conversion circuit unit 3 so as not to exceed a certain level.

The protection circuit unit 1 protects the output-side apparatus 600 from overheating and/or overcurrent of the semiconductor relay device 100. In response to the overheating and/or the flowing of the overcurrent, the protection circuit unit 1 switches the control signal SC to the OFF command state. The protection circuit unit 1 includes an overheat protection circuit unit 10 and an overcurrent protection circuit unit 11. The overheat protection circuit unit 10 switches the control signal SC to the OFF command state in accordance with the temperature of the semiconductor relay device 100, particularly the temperature of the overheat protection circuit unit 10 exceeding a certain value. The overcurrent protection circuit unit 11 switches the control signal SC to the OFF command state in accordance with a current greater than a certain value flowing through the reception circuit 300.

1.1.2. Transmission Circuit and Conversion Circuit Unit

As described above, the transmission circuit 200 and reception circuit 300 are coupled in any manner that allows for signal transmission. The details of the transmission circuit 200 and reception circuit 300, in particular the details of the conversion circuit unit 3, depend on the coupling form. Examples of the transmission circuit 200 and reception circuit 300 with different forms of coupling will be detailed below.

Figure 2:
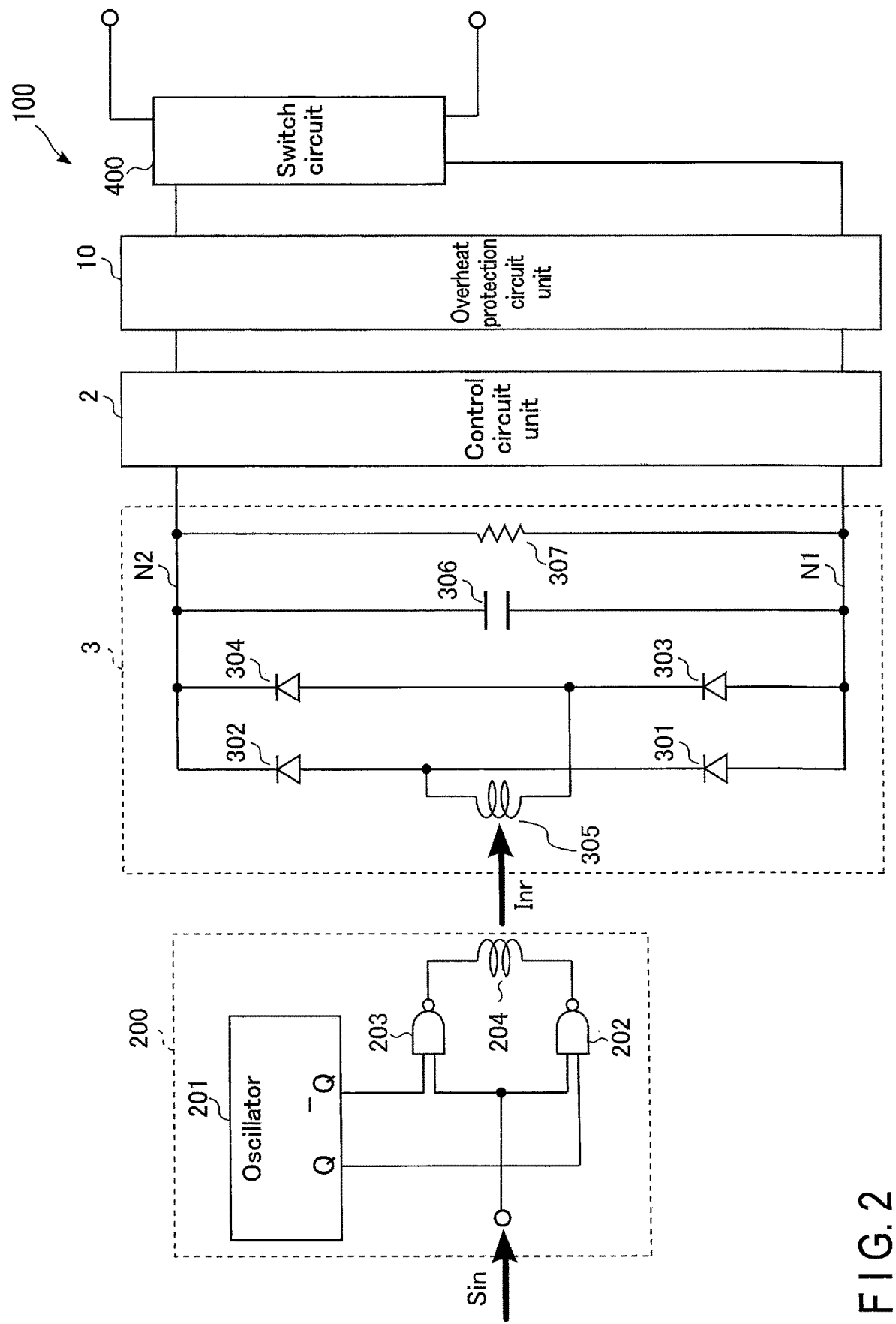
FIG. 2 is a diagram showing the circuitry structure and functional block of a semiconductor relay device of a first coupling type according to the first embodiment.

FIG. 2 shows the circuitry structure and functional block of the semiconductor relay device 100 of the first coupling type according to the first embodiment. In particular, the circuitry structure and functional block of the semiconductor relay device 100 of a magnetic coupling type are illustrated in FIG. 2, where the transmission circuit 200 and reception circuit 300 are magnetically coupled to each other.

As shown in FIG. 2, the transmission circuit 200 includes an oscillator 201, NAND gates 202 and 203, and a coil 204.

The oscillator 201 has an output terminal Q, from which a clock signal having a certain cycle is output. The oscillator 201 also has an output terminal ⁻Q, from which a clock signal having a phase 180-degree shifted from the AC signal output from the output terminal Q is output.

The NAND gate 202 has a first input terminal coupled to the output terminal Q of the oscillator 201. The NAND gate 202 also has a second input terminal, at which an input signal Sin is received. The NAND gate 202 has an output terminal coupled to a first terminal (or, one end) of the coil 204. A driver that receives an output of the NAND gate 202 and has an output terminal coupled to the first terminal of the coil 204 may be provided.

The NAND gate 203 has a first input terminal coupled to the output terminal ⁻Q of the oscillator 201. The NAND gate 203 also has a second input terminal, at which an input signal Sin is received. The NAND gate 203 has an output terminal coupled to a second terminal (or, the other end) of the coil 204. A driver that receives an output of the NAND gate 203 and has an output terminal coupled to the second terminal of the coil 204 may be provided.

In the example of FIG. 2, the input signal Inr is a magnetic signal generated through electromagnetic induction of the coil 204.

The conversion circuit unit 3 includes diodes 301, 302, 303 and 304, a coil 305, a capacitor 306, and a resistor 307.

The diode 301 has an anode coupled to a node N1, and a cathode coupled to the anode of the diode 302. The diode 302 has a cathode coupled to the node N2.

The diode 303 has an anode coupled to the node N1, and a cathode coupled to the anode of the diode 304. The diode 304 has a cathode coupled to the node N2 of the reception circuit 300.

The coil 305 has a first terminal (or, one end) coupled to the cathode of the diode 301 and the anode of the diode 302, and a second terminal (or, the other end) coupled to the cathode of the diode 303 and the anode of the diode 304.

The capacitor 306 has a first terminal (or, one end) coupled to the node N1, and a second terminal (or, the other end) coupled to the node N2.

The resistor 307 has a first terminal (or, one end) coupled to the node N1, and a second terminal (or, the other end) coupled to the node N2.

The coil 305 generates a potential difference between the two ends of the coil 305 based on the input signal Sin, and thereby converts the input signal Sin to an AC electric signal. The diodes 301 to 304, capacitor 306, and resistor 307 convert the alternating current generated by the coil 305 to a smoothed direct current. The smoothed direct current flows through the control circuit unit 2 and overheat protection circuit unit 10 into the switch circuit 400. A not-shown charge pump circuit may be inserted between the transmission circuit 200 and the switch circuit 400.

FIG. 3 shows the circuitry structure and functional blocks of the semiconductor relay device 100 of the second coupling type according to the first embodiment. In particular, the circuitry structure and functional blocks of the semiconductor relay device 100 of a capacitive coupling type are illustrated in FIG. 3, where the transmission circuit 200 and reception circuit 300 are capacitively coupled to each other.

As shown in FIG. 3, the transmission circuit 200 includes an oscillator 201, a p-type metal oxide semiconductor field effect transistor (MOSFET) 211, inverters 212 and 213, a first terminal (or, one end) of a capacitor 214, and a first terminal (or, one end) of a capacitor 215.

The positive electrode of the transmission circuit 200 receives the input signal Sin. The positive electrode is coupled to the source of the transistor 211. The drain of the transistor 211 is coupled to the positive input terminal of the oscillator 201. The negative electrode of the transmission circuit 200 is coupled to the negative input terminal of the oscillator 201 and the gate of the transistor 211. The negative electrode of the transmission circuit 200 may be grounded.

The output terminal Q of the oscillator 201 is coupled to the input terminal of the inverter 212. The output terminal of the inverter 212 is coupled to a first terminal of the capacitor 214.

The output terminal ¯Q of the oscillator 201 is coupled to the input terminal of the inverter 213. The output terminal of the inverter 213 is coupled to a first terminal of the capacitor 215.

In the example of FIG. 3, the input signal Inr is an electric signal based on the charge stored in the capacitors 214 and 215.

The conversion circuit unit 3 include diodes 301, 302, 303 and 304, a capacitor 306, and a resistor 307. The diodes 301, 302, 303 and 304, capacitor 306, and resistor 307 are coupled to each other in the same manner as in the semiconductor relay device 100 of a magnetic coupling type (FIG. 2). The conversion circuit unit 3 includes a second terminal (or, the other end) of the capacitor 214 and a second terminal (or, the other end) of the capacitor 215 in place of the coil 305 in the magnetic coupling type (FIG. 2).

The second terminal of the capacitor 214 is coupled to the cathode of the diode 301 and the anode of the diode 302. The second terminal of the capacitor 215 is coupled to the cathode of the diode 303 and the anode of the diode 304.

The capacitors 214 and 215 store charge based on the input signal Sin, and emit the stored charge. An alternating current is generated based on the emitted charge. The diodes 301 to 304, capacitor 306, and resistor 307 convert the alternating current generated by the capacitors 214 and 215 to a smoothed direct current. The smoothed direct current flows through the control circuit unit 2 and overheat protection circuit unit 10 into the switch circuit 400. A not-shown charge pump circuit may be inserted between the transmission circuit 200 and the switch circuit 400.

Figure 4:
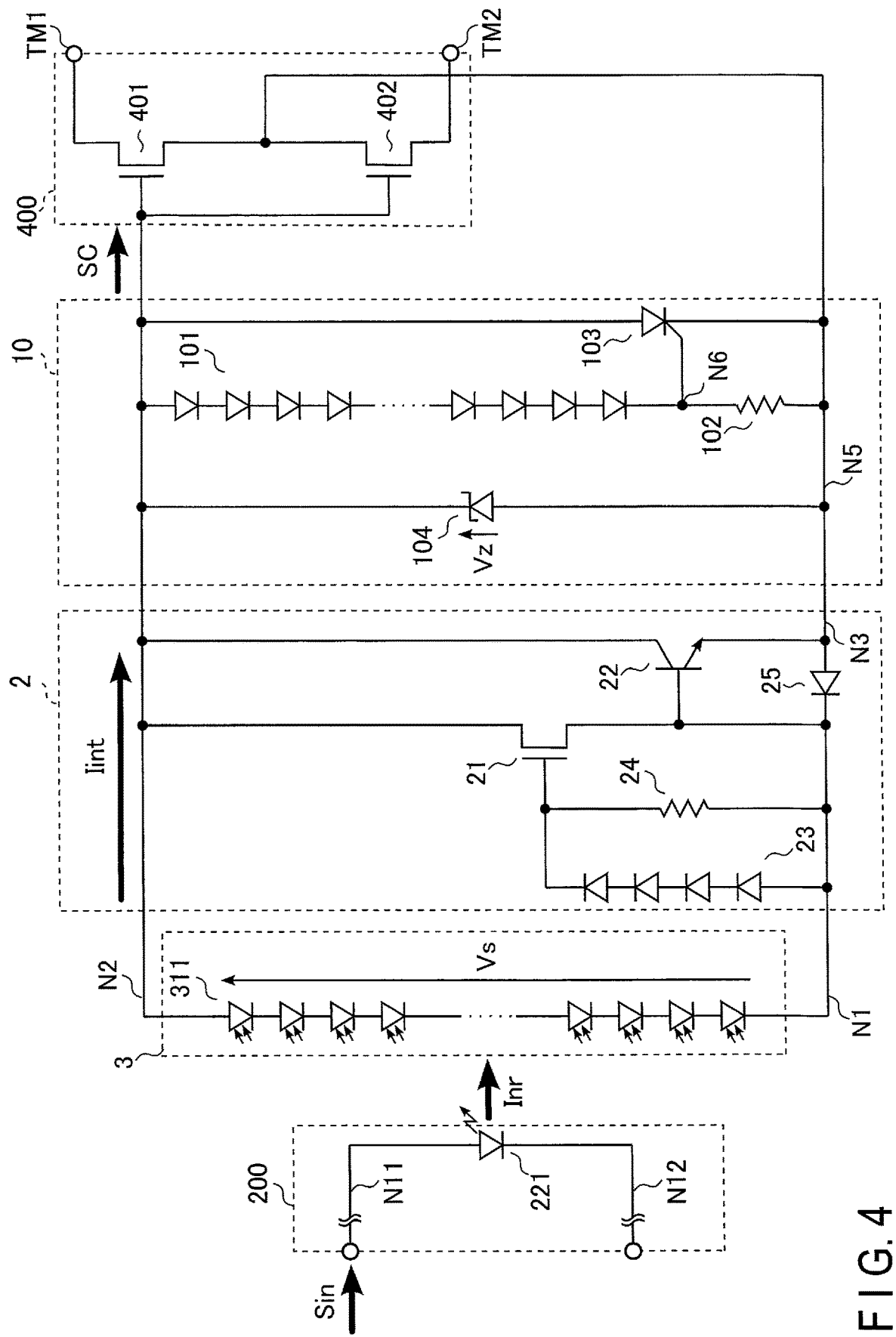
FIG. 4 shows a structure of a circuit of a semiconductor relay device of a third coupling type according to the first embodiment.

FIG. 4 shows the circuitry structure of the semiconductor relay device 100 of the third coupling type according to the first embodiment. In particular, the circuit structure of the semiconductor relay device 100 of the optical coupling type is illustrated in FIG. 4, where the transmission circuit 200 and reception circuit 300 are optically coupled to each other. FIG. 4 further shows exemplary circuit structures of the control circuit unit 2 and overheat protection circuit unit 10. Part of the transmission circuit 200, which relates to outputting only, is illustrated in FIG. 4.

As shown in FIG. 4, the transmission circuit 200 includes a light emitting diode 221. The light emitting diode 221 has an anode coupled to the node N11 of the transmission circuit 200, and a cathode coupled to the node N12 of the transmission circuit 200. The node N12 has a potential lower than that of the node N11. The light emitting diode 221 emits light based on the input signal Sin. In the example of FIG. 4, the input signal Inr is an optical signal based on the emission of the light emitting diode 221.

In the example of FIG. 4, the light emitting diode 221 is driven with a constant current. The light emitting diode 221 may be driven with a constant voltage by way of a resistor (not shown) that is serially coupled to the light emitting diode 221.

The conversion circuit unit 3 includes a plurality of serially coupled photodiodes 311. The set of serially coupled photodiodes 311 has one end coupled to the node N1, and the other end coupled to the node N2. That is, each of the serially coupled photodiodes 311 of the set except for one photodiode 311 at one end of the set has an anode coupled to the cathode of another one of the photodiodes 311. The photodiode 311 at one end of the set of serially coupled photodiodes 311 is coupled to the node N2. The photodiode 311 at the other end of the set of serially coupled photodiodes 311 has a cathode coupled to the node N1. The set of photodiodes 311 generates a photovoltaic power Vs from the node N1 to the node N2 during the period of the photodiodes 311 receiving an input signal Inr. With the photovoltaic power Vs, a current Iint flows through the node N2.

The control circuit unit 2 may have any structure as long as the voltage generated between the node N1 and node N2 can be maintained below a certain voltage based on the current Iint flowing through the node N2. The control circuit unit 2 includes, for example, an n-type MOSFET 21, an npn-type bipolar transistor 22, a plurality of diodes 23, a resistor 24, and a diode 25.

The transistor 21 has a source coupled to the node N2, and a drain coupled to the node N1. The gate of the transistor 21 is coupled to one end of the resistor 24. The other end of the resistor 24 is coupled to the node N1.

The diodes 23 are serially coupled between the node N1 and the gate of the transistor 21. The anode of one of the serially coupled diodes 23 at one end is coupled to the node N1. The cathode of one of the serially coupled diodes 23 at the other end is coupled to the gate of the transistor 21.

The transistor 22 has a collector coupled to the node N2, a base coupled to the node N1, and an emitter coupled to the node N3.

The diode 25 has an anode coupled to the node N3, and a cathode coupled to the node N1.

The overheat protection circuit unit 10 includes the number n (where n is a natural number larger than or equal to 2)

of diodes 101, a resistor 102, a thyristor 103, and a zener diode 104. The overheat protection circuit unit 10 includes a node N5 coupled to the node N3 of the control circuit unit 2.

The zener diode 104 has an anode coupled to the node N5, and a cathode coupled to the node N2. A potential to be adopted as a control signal SC appears on the node N2. The zener diode 104 generates a breakdown voltage or zener voltage Vz between the cathode and anode with the cathode having a higher potential during a period of receiving a backward voltage having a level larger than a certain level. The zener diode 104 has a property of generating between the node N2 and node N5 a breakdown voltage Vz smaller than the photovoltaic power Vs.

The number n of diodes 101 are coupled in series between the node N2 and node N6. A diode 101 at one end of the serially coupled diodes 101 is coupled at its anode to the node N2. A diode 101 at the other end of the serially coupled diodes 101 is coupled at its cathode to the node N6. That is, the number n of diodes 101 include the first diode 101 to the n-th diode 101, and the i-th diode 101 is coupled at its anode to the cathode of the (i−1)-th diode for all cases where i (i being a natural number larger than or equal to 2) is 2 or larger and n−1 or smaller. The first diode 101 is coupled at its anode to the node N2. The n-th diode 101 is coupled at its anode to the cathode of the (n−1)-th diode 101, and at its cathode to the node N6. The number n for the diodes 101 will be discussed later.

The resistor 102 has a first terminal (or, one end) coupled to the node N6, and a second terminal (or, the other end) coupled to the node N5.

The thyristor 103 has an anode coupled to the node N2, and a cathode coupled to the node N5. The thyristor 103 has a control terminal coupled to the node N6.

The switch circuit 400 may have any structure as long as the terminal TM1 and terminal TM2 can be switched to an electrically conductive or non-conductive state in accordance with the control signal SC. For example, the switch circuit 400 includes n-type MOSFETs 401 and 402. The transistor 401 has a drain coupled to the terminal TM1, and a source coupled to the node N5. The transistor 401 has a gate coupled to the node N2.

The transistor 402 has a drain coupled to the terminal TM2, and a source coupled to the node N5. The transistor 402 has a gate coupled to the node N2. As described later, the transistors 401 and 402 are in the ON state while they are receiving the breakdown voltage Vz. The breakdown voltage Vz is set higher than the threshold voltages of the transistors 401 and 402 so that the transistors 401 and 402 can reliably turn on while receiving the breakdown voltage Vz at their gates.

1.1.3. Number of Diodes

The number n for the diodes 101 is determined to satisfy the following conditions. The diodes 101 have a property of being temperature dependent. In particular, a diode 101 generates a lower forward voltage Vf as the temperature of the diode 101 increases. The semiconductor relay device 100 turns the switch circuit 400 off if the temperature of the semiconductor relay device 100 exceeds a temperature Ts while receiving an input signal Inr. That is, the semiconductor relay device 100 is configured to output a control signal SC of an OFF command state in such a case.

In the description below, the forward voltage of each diode 101 when the temperature Ti of the diode 101 is lower than the temperature Ts will be referred to as a forward voltage Vfl. On the other hand, the forward voltage of each diode 101 when the temperature Ti reaches temperature Ts will be referred to as a forward voltage Vfh. Furthermore, the potential difference between the node N2 and node N6 will be referred to as a diode set terminal voltage Vds. In the description below, the temperature Ti being lower than Ts may be referred to as a normal temperature, while the temperature Ti being higher than or equal to the temperature Ts may be referred to as a high temperature.

The number n for the diodes 101 is determined in a manner such that the diode set terminal voltage Vds with the temperature Ti of the diodes 101 being lower than the temperature Ts and the diode set terminal voltage Vds with the temperature Ti of the diodes 101 being the temperature Ts will satisfy the following conditions. In the description below, the diode set terminal voltage Vds under a normal temperature may be referred to as a normal temperature voltage Vdsl. The diode set terminal voltage Vds under a high temperature may be referred to as a high temperature voltage Vdsh.

Figure 5:
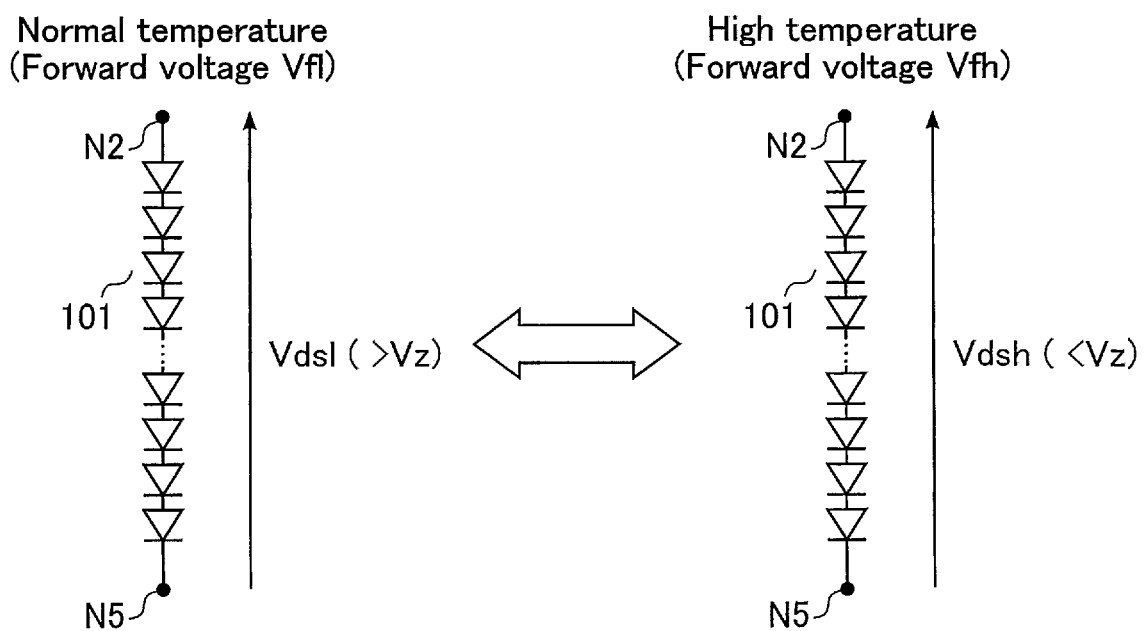
FIG. 5 shows diode set terminal voltages according to the first embodiment under different temperatures.

FIG. 5 shows diode set terminal voltages according to the first embodiment under different temperatures. The left side of FIG. 5 illustrates a normal temperature voltage Vdsl, whereas the right side of FIG. 5 illustrates a high temperature voltage Vdsh. The number n for the diodes 101 is determined to satisfy both the state illustrated in the left side of FIG. 5 and the state illustrated in the right side of FIG. 5.

As shown in the left side of FIG. 5, the forward voltage is Vfl under a normal temperature, and therefore the normal temperature voltage Vdsl, is defined as Vfl×n. The number n is determined in a manner such that the normal temperature voltage Vdsl (=Vfl×n) is higher than the breakdown voltage Vz.

As shown in the right side of FIG. 5, the forward voltage is Vfh under a high temperature, and therefore the high temperature voltage Vdsh is defined as Vfh×n. The number n is determined in a manner such that the high temperature voltage Vdsh (=Vfh×n) is lower than the breakdown voltage Vz.

Figure 6:
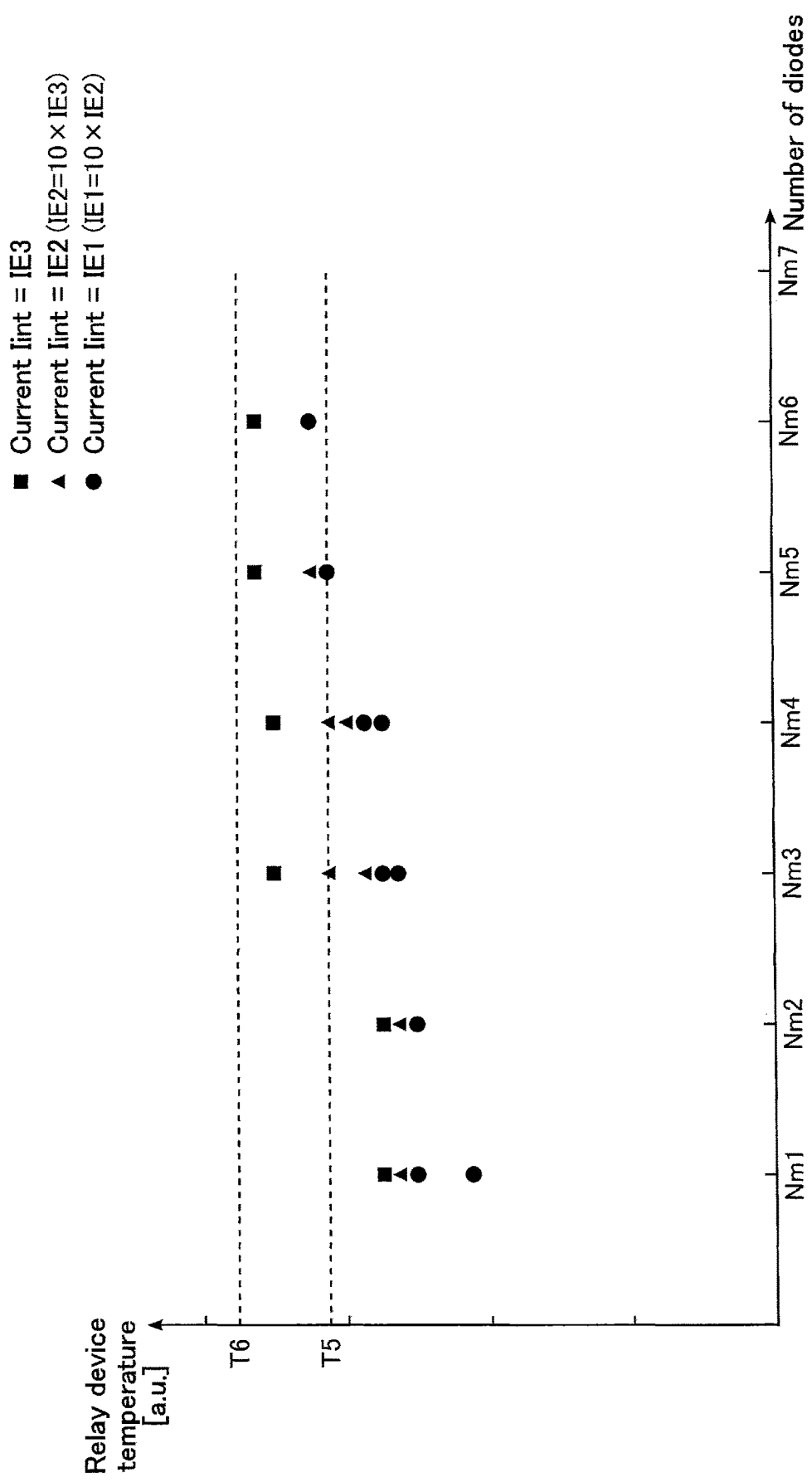
FIG. 6 shows the relationship between the number of diodes in the semiconductor relay device and the temperature of the semiconductor relay device of the third coupling type according to the first embodiment.

FIG. 6 shows the relationship between the number n of diodes in the semiconductor relay device and the temperature of the semiconductor relay device of the third coupling type according to the first embodiment. The vertical and horizontal axes of FIG. 6 are indicated with a linear scale. It is assumed that the semiconductor relay device 100 is intended to perform an operation for protecting the output-side apparatus 600 from overheating effects, or overheat protection operation, for example at a temperature between T5 and T6. Each plotted point indicates the temperature at which the overheat protection operation is initiated. FIG. 6 indicates the results of actual verification on the semiconductor relay devices 100 experimentally prepared by varying the number n, where the current Iint flowing in the semiconductor relay device 100 takes different values. Here, results of verification on the current Iint of IE3, IE2, and IE1 are indicated as examples. IE2 is 10 times larger than IE3, and IE1 is 10 times larger than IE2. The numbers Nm1 to Nm7 in FIG. 6 are each some specific natural number.

As illustrated in FIG. 6, when the number n for the diodes 101 is smaller than or equal to Nm5, an overheat protection operation is initiated at a temperature lower than the temperature T5 with at least one of the currents Iint. On the other hand, if the number is Nm6, an overheat protection operation is initiated within a desired temperature range defined between the temperatures T5 and T6, regardless of the current Iint. Thus, in this example, N6 is chosen for the number of diodes 101 so that the overheat protection operation can be realized within a desired temperature range.

If the overheat protection operation is intended to be performed in a different temperature range, any number other than Nm6 may be chosen for the number n of diodes 101 based on the relationship of FIG. 6 so as to realize the overheat protection operation as desired.

1.2. Operations

Figure 7:
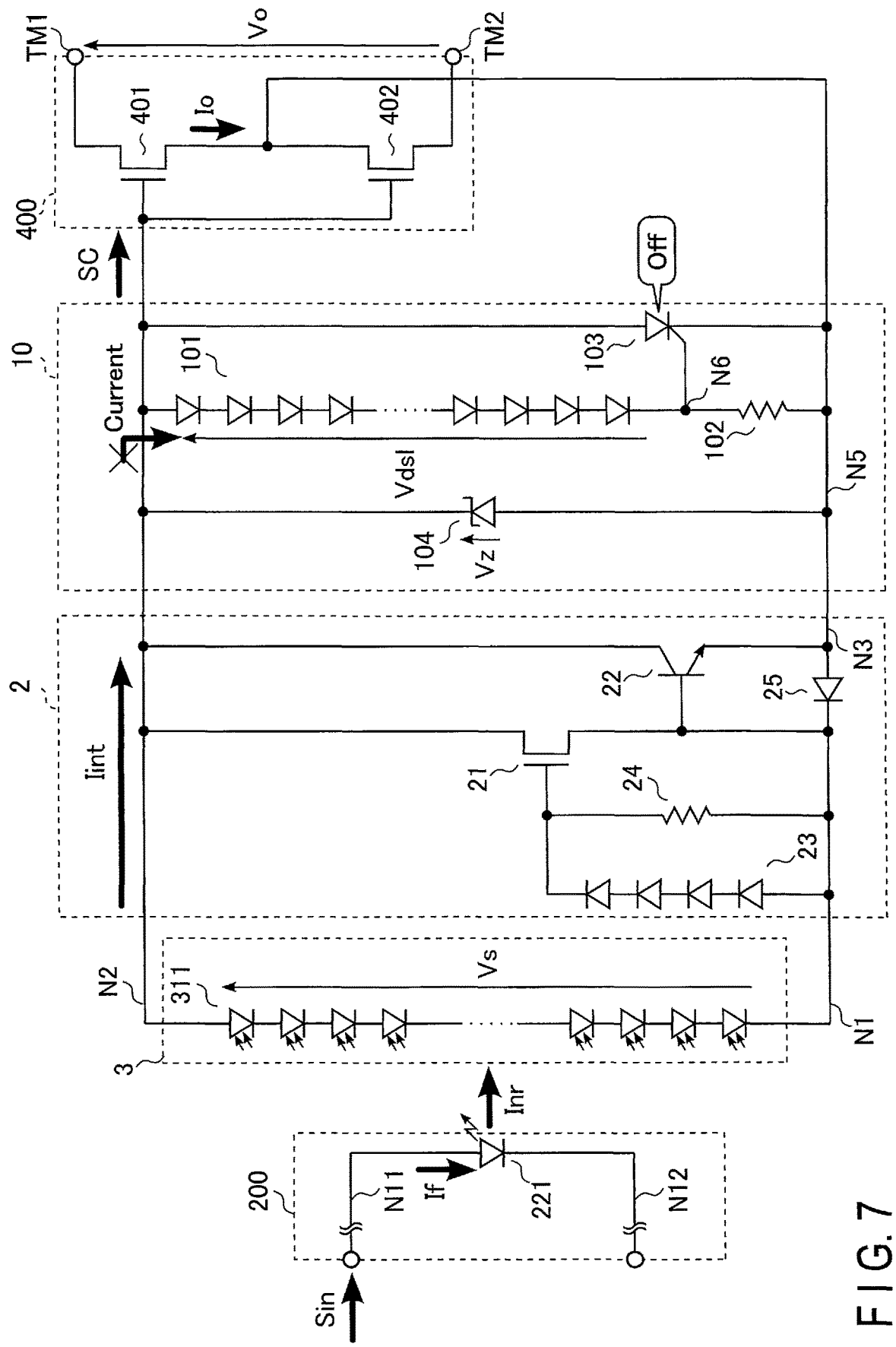
FIG. 7 shows one state of the semiconductor relay device of the third coupling type according to the first embodiment during operation.
Figure 8:
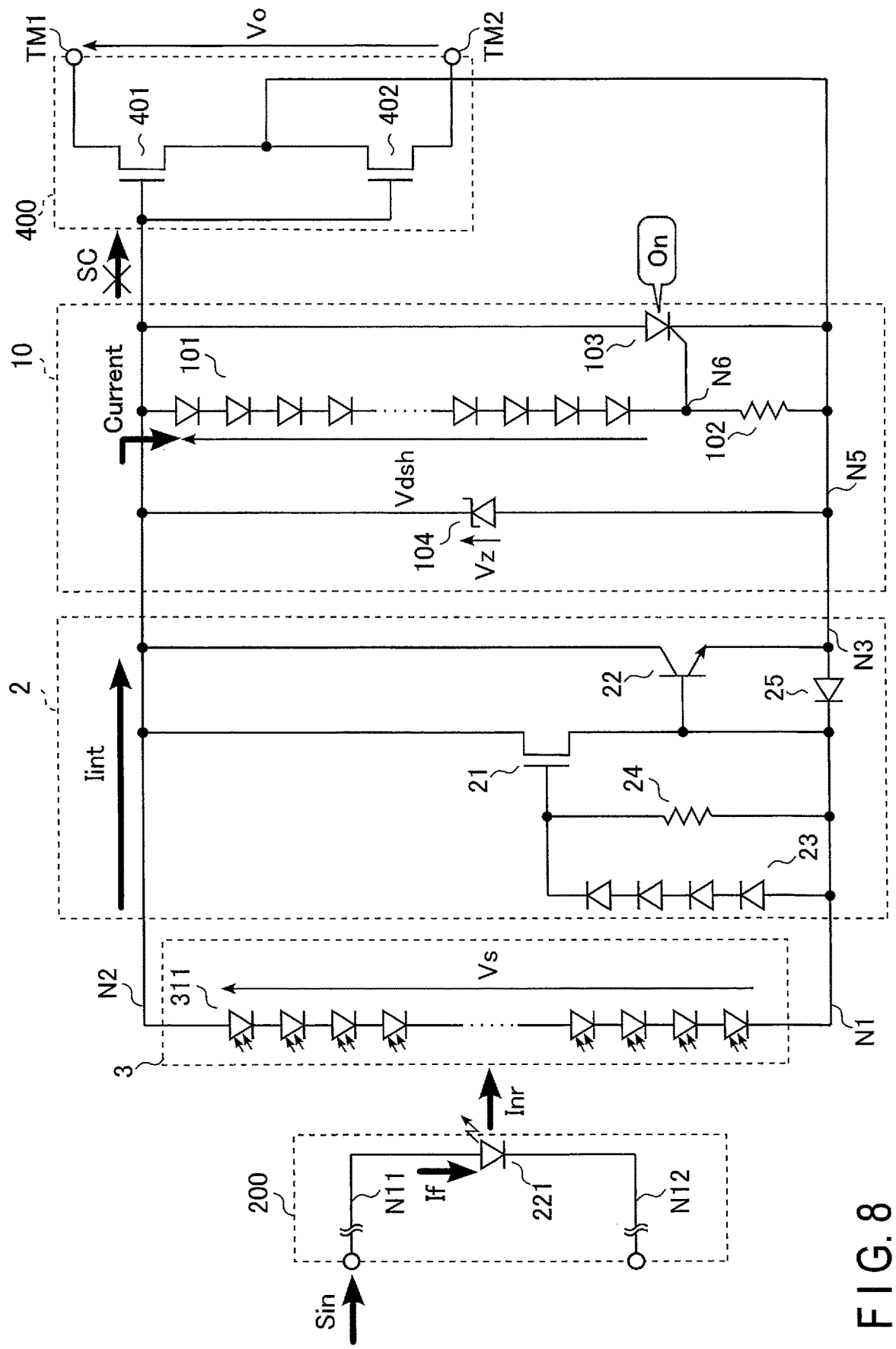
FIG. 8 shows another state of the semiconductor relay device of the third coupling type according to the first embodiment during operation.

Each of FIGS. 7 and 8 shows a state of the operation on the semiconductor relay device 100 of the third coupling type according to the first embodiment. FIG. 7 shows the state under a normal temperature, while FIG. 8 shows the state under a high temperature. In both of FIGS. 7 and 8, an input signal Inr is supplied, and the photovoltaic power Vs is generated by the photodiodes 311.

As illustrated in FIG. 7, in response to the input signal Sin supplied, a current If flows through the light emitting diode 221. With the passage of the current If, an input signal Inr is generated, and received by the photodiodes 311. As a result, a photovoltaic power Vs is generated. With the photovoltaic power Vs, a current Iint flows through the node N2. With the current Iint flowing into the cathode of the zener diode 104, a breakdown voltage Vz is generated between the node N5 and the node N2.

On the other hand, a normal temperature voltage Vdsl is generated between the node N6 and the node N2, the normal temperature voltage Vdsl being higher than the breakdown voltage Vz. For this reason, a current will not flow from the node N2 through the set of diodes 101 to the node N6. This means that the thyristor 103 is in the OFF state. Thus, the breakdown voltage Vz is maintained, and the breakdown voltage Vz generates the control signal SC of the ON command state. With this control signal SC, the switch circuit 400 is in the ON state. In other words, the transistors 401 and 402 are in the ON state, with the terminal TM1 and terminal TM2 being electrically conductive. This means that the potential difference Vo between the terminal TM1 and terminal TM2 is zero. Furthermore, the current Io, which is based on the load of the output-side apparatus 600 (not shown) coupled to the switch circuit 400, flows through the transistors 401 and 402.

As illustrated in FIG. 8, the current Iint flows through the node N2 with the photovoltaic power Vs. With the current Iint flowing into the cathode of the zener diode 104, the breakdown voltage Vz is generated between the node N5 and the node N2.

Between the node N6 and node N2, however, a high temperature voltage Vdsh is generated, and this high temperature voltage Vdsh is lower than the breakdown voltage Vz. For this reason, a current flows from the node N2 through the set of diodes 101 to the node N6. The voltage based on this current and the resistor 102 is applied to the control terminal of the thyristor 103, as a result of which the thyristor 103 is tuned on. With the thyristor 103 turned on, a current path is formed from the node N2 to the node N5 by way of the thyristor 103, and the current flows from the node N2 to the node N5. For this reason, the potential difference between the node N2 and the node N5 is not maintained at the breakdown voltage Vz. This means that a control signal SC of the ON command state is not supplied. In other words, a control signal SC of the OFF command state is supplied. This turns the switch circuit 400 off. The transistors 401 and 402 are therefore turned off, bringing the terminal TM1 and terminal TM2 into an electrically non-conductive state. A potential difference Vo of a certain level is produced between the terminal TM1 and terminal TM2, and the current Io does not flow therebetween.

Once the thyristor 103 is turned on, the ON state of the thyristor 103 is maintained even after a voltage application to the control terminal of the thyristor 103 stops. With the thyristor 103 turned on, there is no longer a potential difference between the node N5 and node N2 and therefore no current flowing through the set of diodes 101; even after this situation, the thyristor 103 maintains the ON state. In other words, the switch circuit 400 maintains the OFF state. The ON state of the thyristor 103 is maintained as long as a current (holding current) of a certain level flows through the thyristor 103 from the anode to the cathode. Thus, once the diodes 101 reach a high temperature, the thyristor 103 maintains an ON state, while the switch circuit 400 maintains an OFF state, even if an input signal Inr continues to be supplied.

The thyristor 103 in the ON state turns off when the current flowing through the thyristor 103 from the anode to the cathode falls to the level of the holding current or lower. In order to turn the thyristor 103 off (or, to reset the thyristor), the supply of the input signal Inr can be stopped.

Figure 9:
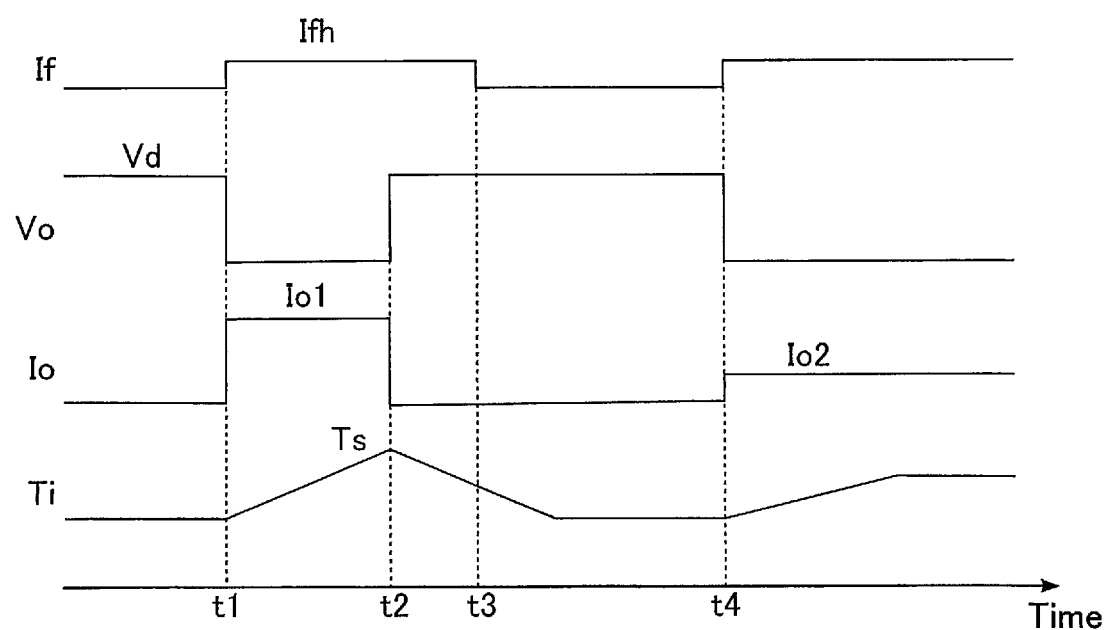
FIG. 9 shows values of several components varying over time during the operation of the semiconductor relay device of the third coupling type according to the first embodiment.

FIG. 9 shows the values of several components over time during the operation of the semiconductor relay device 100 of the third coupling type according to the first embodiment. The current If is zero at the initiation of the operation, as illustrated in FIG. 9, and an input signal Inr is not yet output. The switch circuit 400 is therefore in the OFF state, maintaining the potential difference Vo at a magnitude Vd, and the current Io at zero. The temperature Ti of the diodes 101 is lower than the temperature Ts.

At time t1, a current Ifh having a certain magnitude starts to flow in accordance with a change in the input signal Sin. The current If of the magnitude Ifh flows until time t3. With the current If of the magnitude Ifh flowing, the input signal Inr is output, a photovoltaic power Vs is generated by the photodiodes 311, and a current Iint flows. Since the temperature Ti is lower than the temperature Ts, the reception circuit 300 performs an operation for a normal temperature, which is described with reference to FIG. 7. That is, the reception circuit 300 outputs the control signal SC of the ON command state. With the control signal SC output, the terminals TM1 and TM2 of the switch circuit 400 is electrically conductive to each other, maintaining the potential difference Vo at zero, and the current Io at a magnitude Io1. The magnitude of the current Io depends on the load of the output-side apparatus 600 at time t1.

For whatever reason, the temperature Ti at time t1 rises to the temperature Ts at time t2. Then, the switch circuit 400 performs the operation described with reference to FIG. 8. In particular, the thyristor 103 of the overheat protection circuit unit 10 is turned on, and the reception circuit 300 outputs the control signal SC of the OFF command state. As a result, the potential difference Vo is brought back to the magnitude Vd, and the current Io to zero.

As described with reference to FIG. 8, the state after the temperature Ti reaches the temperature Ts continues as long as the holding current flows through the thyristor 103. For this reason, even if the current If having the magnitude Ifh flows after time t2, the magnitudes of the potential difference Vo and the current Io are maintained. That is, the state presented at time t2 continues until time t3, when the current If of the magnitude Ifh is stopped. In the example of FIG. 9, the temperature Ti starts decreasing at time t2.

At time t3, the value of the current If turns to zero. As a result, the magnitude of the current flowing through the thyristor 103 of the overheat protection circuit unit 10 falls below the holding current, and the thyristor 103 is turned off. In other words, the overheat protection operation of the reception circuit 300 is terminated. Even if the thyristor 103 is turned off, the current If of the magnitude Ifh does not flow. Thus, at time t3, the potential difference Vo is maintained at the magnitude Vd, while the magnitude of the current Io remains at zero.

At time t4, the current If returns to the magnitude Ifh. The temperature Ti is below the temperature Ts at time t4. For this reason, the reception circuit 300 can perform an operation for a normal temperature, the potential difference Vo becomes zero, and the current Io increases to Io2.

1.3. Advantages (Advantageous Effects)

According to the first embodiment, a semiconductor relay device configured to protect the secondary-side or output-side apparatus from overheating can be offered without requiring an external power supply on the output side, as described below.

The overheat protection operation can be realized by utilizing the temperature dependency of a forward voltage of the diodes. In general, a method is adopted with which a reference voltage is applied to the non-inverting input of an operational amplifier, and the diodes are coupled to the inverting input. If the forward voltage of the diodes increases with an increase in the temperature and the voltage of the inverting input falls below the reference voltage, the output of the operational amplifier is inverted, initiating the overheat protection operation. Such a method requires a constant current source or a constant voltage source for supplying a current to the diodes.

In contrast, some of the semiconductor relay devices such as the semiconductor relay device 100 according to the first embodiment include a transmission circuit and a reception circuit that are magnetically, capacitively or optically coupled to each other while being separated through electrical insulation from each other. The reception circuit functions using a minute current or voltage based on input signals from the transmission circuit such as a magnetic signal, a capacitance-based electric signal, or an optical signal, without requiring a constant current source or a constant voltage source. When providing the reception circuit of such a semiconductor relay device with an overheat protection capability, the overheat protection circuit needs to be driven by a current or voltage generated based on an input signal from the transmission circuit. However, since a minute current or voltage generated from the input signal is used for the overheat protection circuit, the intended operation of the reception circuit, or in other words, the capability of turning the switch circuit 400 on/off, may be hampered.

Moreover, a protection circuit including an overheat protection circuit may be arranged outside the chip of the reception circuit. With this arrangement, the protection circuit is provided on the circuit board of the semiconductor relay device on which the reception circuit chip is mounted. This requires a large area in the circuit board. The design of the semiconductor relay device including the operation of a protection circuit will also become complicated.

The reception circuit 300 according to the first embodiment includes a zener diode 104, a plurality of diodes 101, and a thyristor 103. The zener diode 104 generates a voltage to be supplied to the switch circuit 400. The diodes 101 are serially coupled to each other in a manner antiparallel to the zener diode 104. The thyristor 103 is coupled in a manner antiparallel to the zener diode 104, and has a control terminal coupled to one end of the diodes 101. With the input signal Inr supplied to the reception circuit 300, the breakdown voltage Vz is output as a control signal SC when the reception circuit 300 is at a normal temperature. On the other hand, when the reception circuit 300 reaches a temperature Ts, a current flows through the diodes 101 with a lowered forward voltage Vf, and this current turns the thyristor 103 on and pulls the voltage of the control signal SC to the ground voltage so that the switch circuit 400 is turned off. As a result, the overheat protection operation is initiated.

During the normal temperature state, the normal temperature voltage Vdsl, which is a potential difference between the two ends of the set of the diodes 101, is higher than the breakdown voltage Vz, and therefore a current will not flow through the diodes 101. This means that the overheat protection circuit unit 10 will not consume any current during the normal temperature state. In addition, a decrease in the voltage of the control signal SC is triggered by the thyristor 103 turning on, and once the thyristor 103 turns on, the ON state is autonomously maintained, which does not require a current. For this reason, after the initiation of the overheat protection operation, the reception circuit 300 continues this operation, regardless of the presence/absence of an input signal Inr. The overheat protection circuit unit 10, which does not require the continuous consumption of a current or voltage, will not hamper the operation of the reception circuit 300. Thus, the reception circuit 300 can successfully perform its intended operation as well as the overheat protection operation, without requiring a constant current source.

Figure 10:
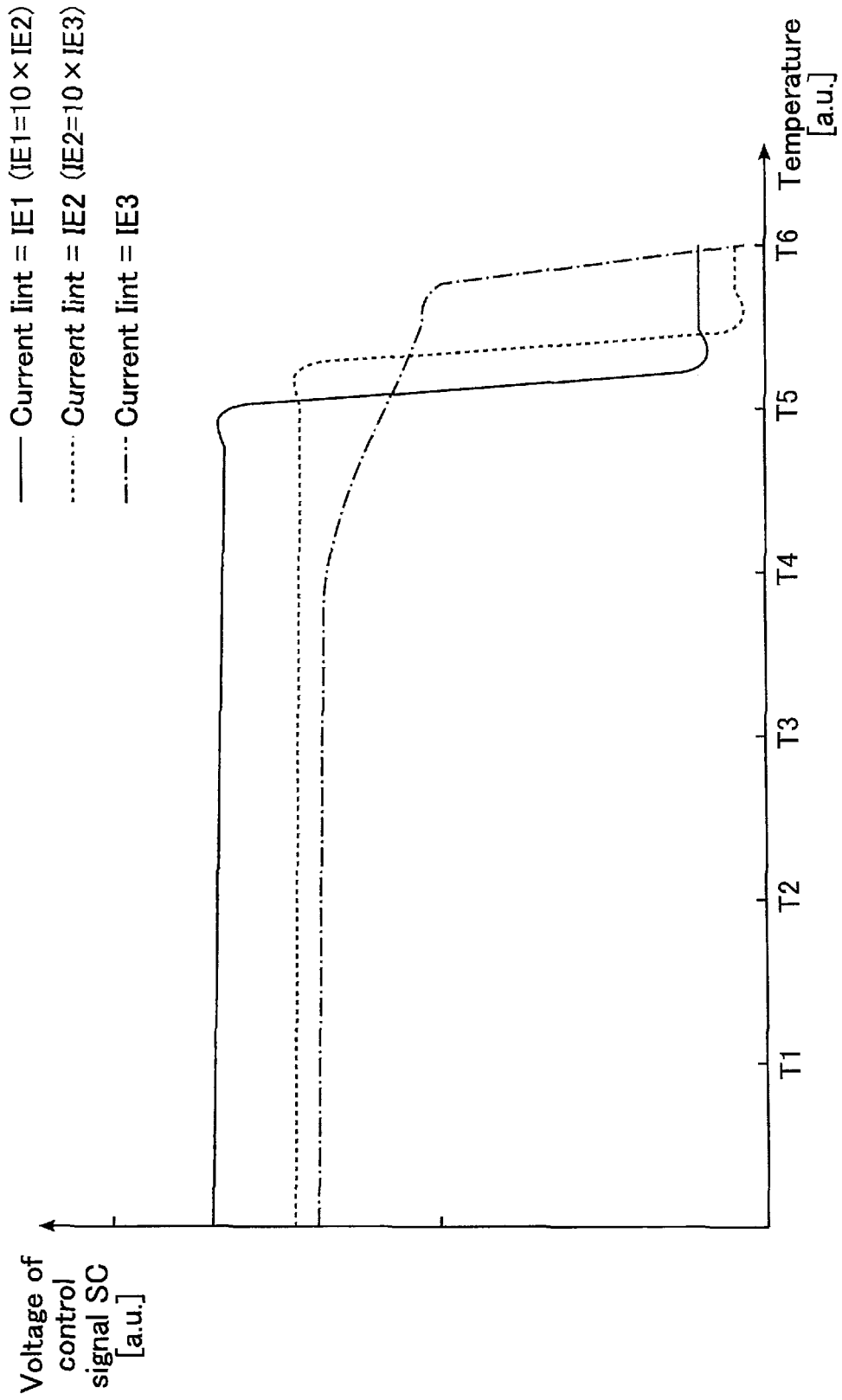
FIG. 10 shows the relationship between the temperature of a reception circuit and the voltage of a control signal according to the first embodiment.

FIG. 10 shows the relationship between the temperature of the reception circuit 300 according to the first embodiment and the voltage of the control signal SC. In the example of FIG. 10, the number of diodes 101 is Nm6, as shown in FIG. 6.

For any current Iint of magnitudes IE1, IE2, and IE3, the voltage remains constant up to the temperature T5, and after the temperature increases beyond T5, the voltage considerably decreases, as indicated in FIG. 10. This means that the overheat protection operation is initiated at the temperature T5. This also shows that, as discussed with reference to FIG. 6, the overheat protection operation is implemented between the temperature T5 and temperature T6, as intended.

The initiation of the overheat protection operation is based on the timing of the thyristor 103 being turned on, which is based on the number n of diodes 101 that are coupled in series. This facilitates the design of the reception circuit 300 capable of initiating the overheat protection operation within the target temperature range. The timing of turning on the thyristor 103 may be set by adopting a level of a resistance as a control element. Changes to the resistance at the time of designing, however, may affect a wide range of the circuit, and may complicate the design. In addition, it may not be easy to produce a resistor having a resistance as designed. With the level of the resistance adopted as a control element, it may become difficult to design and realize a circuit including such an element. In contrast, according to the first embodiment, as described with reference to FIG. 6, the timing of turning on the thyristor 103, and eventually the timing of initiating the overheat protection operation, can be determined based on the number n of diodes 101. The range of temperature at which the overheat protection operation is initiated can be readily realized by regulating the number n of diodes 101, as illustrated in FIG. 6. In addition, it is easier to form the targeted number n of diodes 101 than to finely adjust the level of the resistance. This means that it is easier to produce a reception circuit 300 capable of performing an overheat protection operation within a targeted temperature range than to produce a reception circuit 300 adopting the level of resistance as a control element.

1.4. Modification and Application Examples

As illustrated in FIG. 11, the semiconductor relay device 100 may include a mechanism for protecting the switch circuit 400 from the application of an overvoltage such as a surge. FIG. 11 shows an application example of the semiconductor relay device 100 according to the first embodiment, focusing on an exemplary switch circuit 400.

As illustrated in FIG. 11, the switch circuit 400 includes zener diodes 411 to 418.

The zener diodes 411 and 412 are coupled to each other at their anodes. The cathode of the zener diode 411 is coupled to the gate of the transistor 401. The cathode of the zener diode 412 is coupled to the terminal TM1 and the drain of the transistor 401.

The zener diodes 413 and 414 are coupled to each other at their anodes. The cathode of the zener diode 413 is coupled to the gate of the transistor 401. The cathode of the zener diode 414 is coupled to the source of the transistor 401.

The zener diodes 415 and 416 are coupled to each other at their anodes. The cathode of the zener diode 415 is coupled to the gate of the transistor 402. The cathode of the zener diode 416 is coupled to the source of the transistor 402.

The zener diodes 417 and 418 are coupled to each other at their anodes. The cathode of the zener diode 417 is coupled to the gate of the transistor 402. The cathode of the zener diode 418 is coupled to the terminal TM2 and the drain of the transistor 402.

Figure 12:
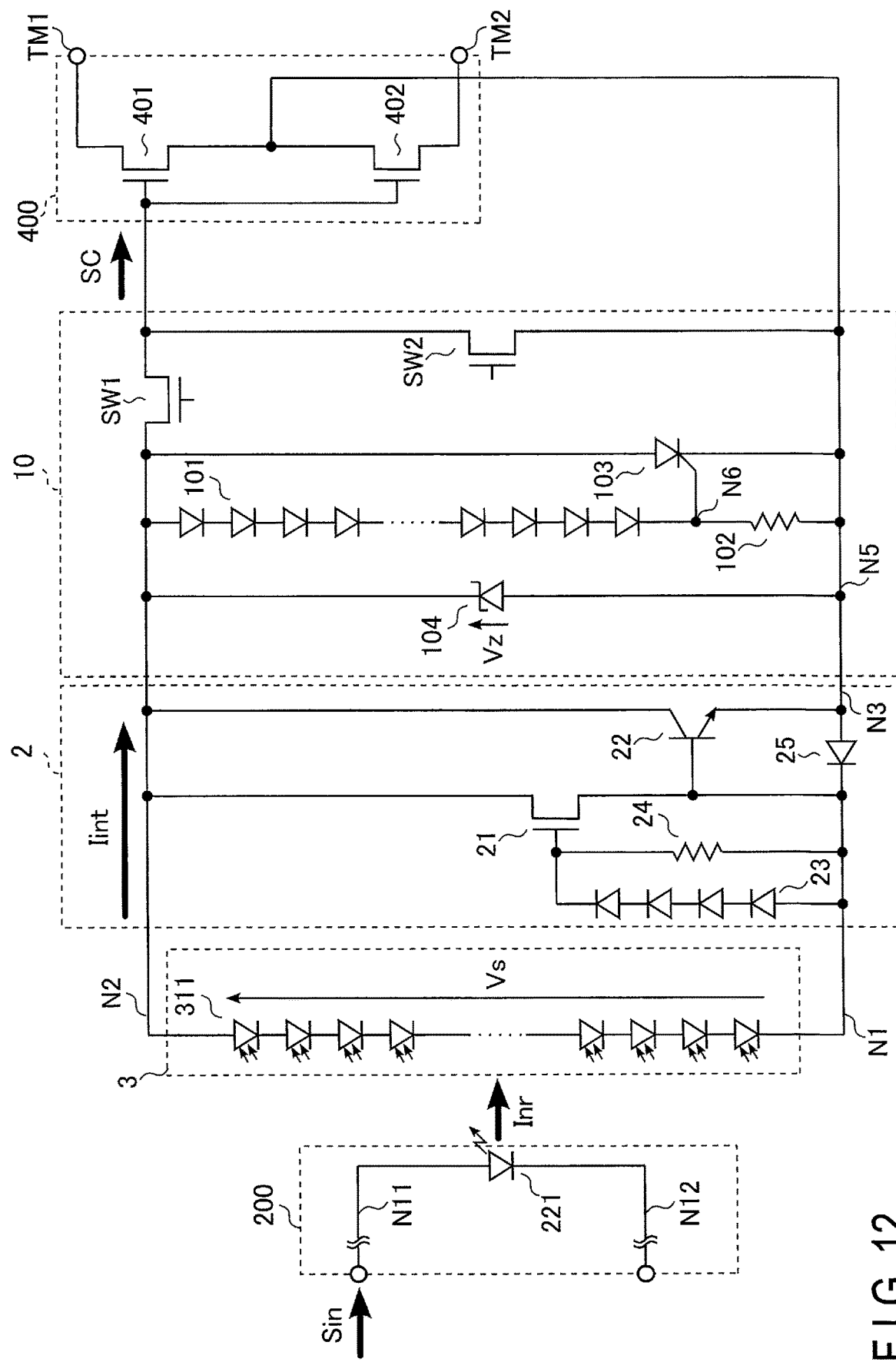
FIG. 12 shows a circuit structure of a semiconductor relay device of the third coupling type according to a modification example of the first embodiment.

The reception circuit 300, or the reception circuit 300 and switch circuit 400, may have a structure illustrated in FIG. 12, which is described below. FIG. 12 shows the circuit structure of the semiconductor relay device 100 of the third coupling type according to a modification example of the first embodiment.

In addition to the structure of FIG. 4, the semiconductor relay device 100 includes switches SW1 and SW2 as illustrated in FIG. 12.

The switch SW1 may be an n-type MOSFET. FIG. 12 illustrates this example. The switch SW1 is coupled at one end to the anode of the thyristor 103, and at the other end to the gates of the transistors 401 and 402. The switch SW1 may be included in the reception circuit 300, or in the switch circuit 400. FIG. 12 shows an example of the switch SW1 included in the reception circuit 300 (the overheat protection circuit unit 10, in particular).

The switch SW2 may be an n-type MOSFET. FIG. 12 illustrates this example. The switch SW2 is coupled at one end to the gates of the transistors 401 and 402, and at the other end to the node N5. The switch SW2 may be included in the reception circuit 300, or in the switch circuit 400. FIG. 12 shows an example of the switch SW2 included in the reception circuit 300 (the overheat protection circuit unit 10, in particular).

The switches SW1 and SW2 turn on in a complementary manner. In other words, if one turns on, the other turns off so that the control terminal (or, the gate if the switches SW1 and SW2 are transistors) of one of the switches can receive a signal. The on/off control of the switches SW1 and SW2 can be conducted by the potential on the node N6.

Alternatively, the on/off control of the switches SW1 and SW2 may be realized by a pair of a normally-on transistor and a normally-off transistor.

The on/off control of the switches SW1 and SW2 may also be realized by a logic circuit (not shown) supplying a signal to the control terminal of each of the switches SW1 and SW2. The logic circuit receives a potential on the node N6, converts this potential to a digital signal, and supplies a signal based on the converted digital signal to the control terminals of the switches SW1 and SW2. The power required for the operation of the logic circuit may be supplied from the photovoltaic power generated when a set of serially coupled photodiodes similar to the set of photodiodes 311 receives an input signal Inr.

In such a structure, when the control signal SC is in the ON command state (or, with the thyristor 103 being off in a manner similar to FIG. 7), the switch SW1 is on, while the switch SW2 is off. Thus, the transistors 401 and 402 are on, and the gates of the transistors 401 and 402 are not coupled to the node N5. On the other hand, when the control signal SC is in the OFF command state (or, with the thyristor 103 being on in a manner similar to FIG. 8), the switch SW1 is off, while the switch SW2 is on. As a result, the switch SW2 couples the gates of the transistors 401 and 402 to the node N5. With such an operation, the transistors 401 and 402 can be more reliably based on the on/off state of the thyristor 103 than in the structure of FIG. 4. For this reason, even if there is a difference between the impedance when the thyristor 103 is on and the impedance when the thyristor 103 is off, and/or a variance in the magnitude of the input signal Inr, the transistors 401 and 402 will be prevented from being turned on/off in an unintended manner.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor relay device comprising:
a transmission circuit that outputs a first signal;
a conversion circuit configured to output a second signal that is based on the first signal over a period of receiving the first signal;
an overheat protection circuit that keeps outputting a control signal having a first magnitude using the second signal over a period of receiving the second signal and having a temperature lower than a first temperature, transitions to a state in which the overheat protection circuit outputs the control signal having a second magnitude using the second signal when the overheat protection circuit has a temperature higher than or equal to the first temperature during a period of receiving the second signal, and keeps outputting the control signal having the second magnitude once the overheat protection circuit has a temperature higher than or equal to the first temperature; and
a switch circuit that electrically connects a first terminal and a second terminal over a period of receiving the control signal having the first magnitude, and electrically disconnects the first terminal and the second terminal over a period of receiving the control signal having the second magnitude.

2. The semiconductor relay device according to claim 1, wherein:
the overheat protection circuit keeps outputting the control signal having the second magnitude regardless of whether the overheat protection circuit is receiving the second signal once the overheat protection circuit has a temperature higher than or equal to the first temperature.

3. The semiconductor relay device according to claim 1, wherein:
the conversion circuit outputs the second signal at a first node,
the overheat protection circuit includes:
a zener diode having an anode coupled to a second node and a cathode coupled to the first node;
a resistor coupled between the second node and a third node;
a number n of diodes that are serially coupled, wherein an anode of a diode at a first end of the n diodes is coupled to the first node, and a cathode of a diode at a second end of the n diodes is coupled to the third node, where n is a natural number larger than or equal to 2; and
a thyristor having an anode coupled to the first node, a cathode coupled to the second node, and a control terminal coupled to the third node, and
the switch circuit includes a first transistor having a gate coupled to the first node.

4. The semiconductor relay device according to claim 3, wherein:
the n diodes include a first to an $n^{th}$ diode,
an anode of an $i^{th}$ diode is coupled to a cathode of an $(i-1)^{th}$ diode for all cases of i where i is a natural number larger than or equal to 2 and smaller than or equal to n,
an anode of the first diode is coupled to the first node, and
an anode of the $n^{th}$ diode is coupled to a cathode of the $(n-1)^{th}$ diode, and a cathode of the $n^{th}$ diode is coupled to the third node.

5. The semiconductor relay device according to claim 4, wherein:
the conversion circuit outputs the second signal having a first voltage across the first node and a fourth node coupled to the second node via a diode over a period of receiving the first signal, and
a breakdown voltage of the zener diode is lower than the first voltage.

6. The semiconductor relay device according to claim 5, wherein:
the breakdown voltage is higher than a threshold voltage of the first transistor.

7. The semiconductor relay device according to claim 6, wherein:
each of the n diodes has a forward voltage having a first magnitude when the each of the n diodes has a second temperature smaller than the first temperature, and has a forward voltage having a second magnitude smaller than the first magnitude when the diode has a third temperature higher than the first temperature.

8. The semiconductor relay device according to claim 6, wherein:
the transmission circuit is a light emitting diode, and
the conversion circuit includes a photodiode.

9. The semiconductor relay device according to claim 7, wherein:
the n diodes generate, between the second end and the first end, a first forward voltage when the diodes have the second temperature, and a second forward voltage when the diodes have the third temperature,
the first forward voltage is higher than the breakdown voltage, and
the second forward voltage is lower than the breakdown voltage.

10. The semiconductor relay device according to claim 3, wherein:
the switch circuit includes:
a second transistor coupled between the first node and the gate of the first transistor; and
a third transistor coupled between the gate of the first transistor and the second node.

11. The semiconductor relay device according to claim 1, wherein:
the switch circuit includes:
a fourth transistor having a third end coupled to the first terminal and a fourth end;
a fifth transistor having a fifth end coupled to the fourth end and a sixth end coupled to the second terminal;
a second zener diode having a cathode coupled to the third end;
a third zener diode having an anode coupled to an anode of the second zener diode and having a cathode coupled to a gate of the fourth transistor;
a fourth zener diode having a cathode coupled to the fourth end;
a fifth zener diode having an anode coupled to an anode of the fourth zener diode and having a cathode coupled to the gate of the fourth transistor;
a sixth zener diode having a cathode coupled to the fifth end;
a seventh zener diode having an anode coupled to an anode of the sixth zener diode and having a cathode coupled to a gate of the fifth transistor;
an eighth zener diode having a cathode coupled to the sixth end; and
a ninth zener diode having an anode coupled to an anode of the eighth zener diode and having a cathode coupled to the gate of the fifth transistor.

* * * * *